(12) United States Patent
Clifton

(10) Patent No.: US 9,029,686 B2
(45) Date of Patent: May 12, 2015

(54) STRAIN-ENHANCED SILICON PHOTON-TO-ELECTRON CONVERSION DEVICES

(71) Applicant: Acorn Technologies, Inc., Santa Monica, CA (US)

(72) Inventor: Paul A Clifton, Redwood City, CA (US)

(73) Assignee: Acorn Technologies, Inc., Santa Monica, CA (US)

(*) Notice: Subject to any disclaimer, the term of this patent is extended or adjusted under 35 U.S.C. 154(b) by 0 days.

(21) Appl. No.: 13/870,698

(22) Filed: Apr. 25, 2013

(65) Prior Publication Data

US 2013/0284269 A1    Oct. 31, 2013

Related U.S. Application Data

(62) Division of application No. 12/404,782, filed on Mar. 16, 2009, now Pat. No. 8,450,133.

(51) Int. Cl.

| | |
|---|---|
| H01L 31/068 | (2012.01) |
| H01L 31/028 | (2006.01) |
| H01L 31/0352 | (2006.01) |
| H01L 31/0687 | (2012.01) |
| H01L 31/07 | (2012.01) |
| H01L 31/103 | (2006.01) |
| H01L 31/107 | (2006.01) |
| H01L 31/109 | (2006.01) |
| H01L 31/18 | (2006.01) |
| H01L 31/0304 | (2006.01) |

(52) U.S. Cl.
CPC ............ *H01L 31/068* (2013.01); *H01L 31/028* (2013.01); *H01L 31/0304* (2013.01); *H01L 31/035281* (2013.01); *H01L 31/0687* (2013.01); *H01L 31/07* (2013.01); *H01L 31/103* (2013.01); *H01L 31/107* (2013.01); *H01L 31/109* (2013.01); *H01L 31/1804* (2013.01); *H01L 31/1808* (2013.01); *H01L 31/184* (2013.01); *Y02E 10/544* (2013.01); *Y02E 10/547* (2013.01)

(58) Field of Classification Search
USPC ............................. 438/57; 136/252, 254, 261
See application file for complete search history.

(56) References Cited

U.S. PATENT DOCUMENTS

| | | | | |
|---|---|---|---|---|
| 6,087,197 | A * | 7/2000 | Eriguchi et al. | 438/42 |
| 7,596,158 | B2 * | 9/2009 | Liu et al. | 372/43.01 |
| 8,294,025 | B2 * | 10/2012 | Fonash et al. | 136/256 |
| 8,731,017 | B2 * | 5/2014 | Clifton et al. | 372/45.011 |
| 2005/0285121 | A1 * | 12/2005 | Kim | 257/79 |
| 2006/0292719 | A1 * | 12/2006 | Lochtefeld et al. | 438/22 |
| 2007/0170541 | A1 * | 7/2007 | Chui et al. | 257/506 |
| 2007/0259467 | A1 * | 11/2007 | Tweet et al. | 438/48 |
| 2009/0039361 | A1 * | 2/2009 | Li et al. | 257/94 |

FOREIGN PATENT DOCUMENTS

WO   WO PCT/US2010/025942   7/2010

* cited by examiner

*Primary Examiner* — Savitr Mulpuri
(74) *Attorney, Agent, or Firm* — Orrick Herrington & Sutcliffe LLP

(57) ABSTRACT

Improved silicon solar cells, silicon image sensors and like photosensitive devices are made to include strained silicon at or sufficiently near the junctions or other active regions of the devices to provide increased sensitivity to longer wavelength light. Strained silicon has a lower band gap than conventional silicon. One method of making a solar cell that contains tensile strained silicon etches a set of parallel trenches into a silicon wafer and induces tensile strain in the silicon fins between the trenches. The method may induce tensile strain in the silicon fins by filling the trenches with compressively strained silicon nitride or silicon oxide. A deposited layer of compressively strained silicon nitride adheres to the walls of the trenches and generates biaxial tensile strain in the plane of adjacent silicon fins.

12 Claims, 6 Drawing Sheets

STRAIN-ENHANCED SILICON PHOTON-TO-ELECTRON CONVERSION DEVICES

CROSS REFERENCE TO RELATED APPLICATIONS

This application is a divisional of U.S. application Ser. No. 12/404,782, filed Mar. 16, 2009, entitled, "Strain-Enhanced Silicon Photon-To-Electron Conversion Devices" and incorporated by reference in its entirety.

BACKGROUND

1. Field of the Invention

The present invention relates to solar cells, photodetectors and imaging devices that incorporate a strained semiconductor and, more specifically, strained silicon.

2. Description of the Related Art

One way to convert energy from light into electricity is to use silicon to capture photons and produce electron-hole pairs. This is important both for solar cells and for image sensors.

The amount of energy captured by a silicon photovoltaic solar cell (simply "solar cell" in this document) is a function of the wavelengths of the incident light. Silicon has a high absorption rate for energy in the short wavelength portion of the visible spectrum and for UV wavelengths. The absorption rate declines as the wavelengths get longer, and drops to near zero for long wavelength infrared light.

The absorption coefficient of silicon for various wavelengths is shown in FIG. 1. The visible spectrum is the range of wavelengths from about 0.4 microns to 0.7 microns. The absorption coefficient varies by more than by a factor of ten over the visible light spectrum. The band gap of crystalline silicon is 1.12 eV at room temperature. Silicon is substantially transparent to light of photon wavelengths less than its band gap. In contemporary silicon based image sensors, efficiency of detection of red light (photons just above the band gap) is low compared to the efficiency of detection of green and blue wavelengths.

It is known that the band gap of silicon varies when silicon is strained so that its crystal lattice spacing is increased or decreased. If the silicon is under tensile strain so that its lattice spacing is increased compared with unstrained silicon, the band gap is smaller.

SUMMARY OF THE PREFERRED EMBODIMENTS

It would be advantageous to modify a semiconductor to capture photons with energies less than the fundamental band gap (i.e., photons of longer wavelength light) so as to increase the efficiency of solar cells and image sensors.

Furthermore, there is significant interest in detecting and imaging of near infrared light for, e.g., optical communications, night vision, industrial inspection, and automotive applications. In the case of a device fabricated in silicon, if the band gap of silicon can be lowered in a photo-sensitive region of the device, the device would be more sensitive to near infrared wavelengths than a similar device fabricated in conventional silicon. That is, modified silicon's optical detection limit would be shifted further into the infrared region of the spectrum and optical absorption efficiency of modified silicon would be increased for red and near infrared radiation.

An aspect of the present invention provides a photosensitive device, comprising a silicon substrate having a plurality of trenches on a surface. The trenches are positioned to define at least one silicon fin. At least two of the trenches contain tensile or compressively stressed material that induces stress within the at least one silicon fin to reduce the band gap of at least a portion of the silicon within the at least one silicon fin.

Another aspect of the present invention provides a method of making a photosensitive device, comprising providing a silicon substrate and forming a mask on the silicon substrate. The mask has a mask pattern. The method includes etching into the silicon substrate according to the mask pattern to form a plurality of grooves and so that pairs of grooves define a plurality of silicon fins. Stress is induced within at least a portion of two or more of the silicon fins and electrodes are formed to provide electrical connections to the photosensitive device. The stress within the two or more silicon fins reduces the energy band gap of the at least a portion of two or more silicon fins and increases the sensitivity of the photosensitive device for wavelengths of light close to the long wavelength absorption limit of silicon which corresponds to the fundamental energy band gap of approximately 1.12 electron Volts at room temperature. Furthermore the reduced energy gap in strained silicon regions extends the range of sensitivity of a photo-sensitive silicon device to longer wavelengths of light corresponding to photon energies less than a fundamental energy band gap of bulk unstrained silicon.

DETAILED DESCRIPTION OF THE PREFERRED EMBODIMENTS

Figure 1:
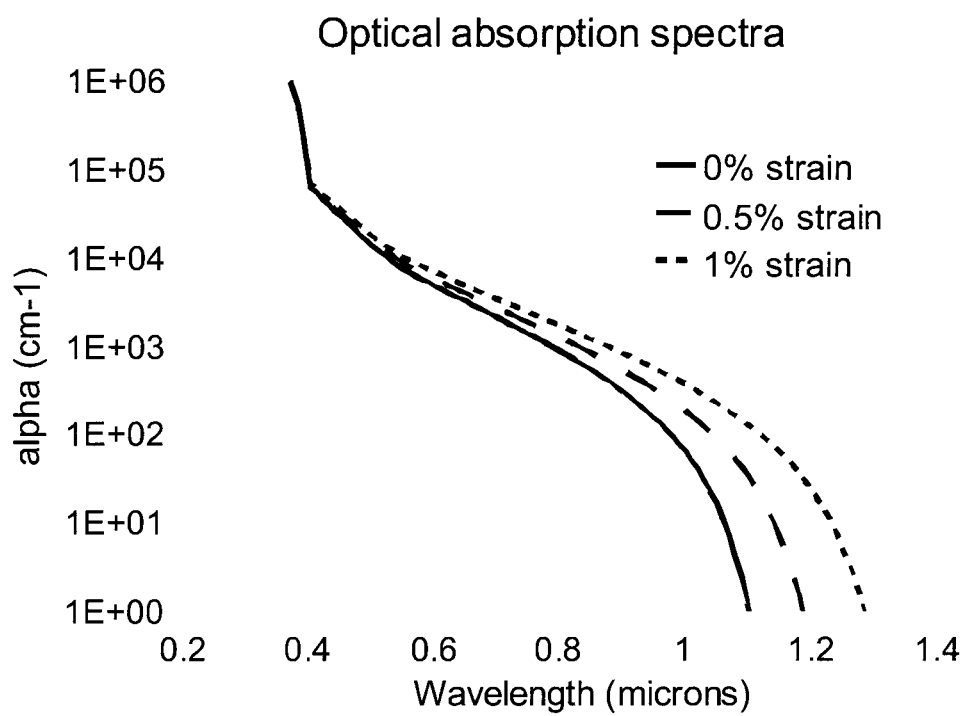
FIG. 1 illustrates the absorption coefficient of silicon as a function of wavelength for unstrained and different levels of strain in the silicon.

Particularly preferred silicon solar cells, silicon image sensors, photodetectors, avalanche photodetectors or similar photosensitive devices are made to include stressed silicon at or sufficiently near the junctions or other active regions of the devices to provide increased sensitivity to longer wavelength light. Stressed silicon has a lower band gap than conventional silicon. One method of making a solar cell that contains stressed silicon etches a set of parallel trenches into a silicon wafer and induces stress in the silicon fins between the trenches. The method may induce stress in the silicon fins by lining or filling the trenches with tensile or compressively stressed silicon nitride, silicon oxide, or silicon oxynitride. A deposited layer of stressed silicon nitride adheres to the walls of the trenches and generates stress in the adjacent silicon fins.

Implementations according to the present invention include both silicon solar cells and silicon image sensors. The preferred embodiments are primarily described in terms of solar cells, but it should be understood that the preferred embodiments include image sensors, photodetectors and avalanche photodetectors for application in silicon photonics as well. Preferred embodiments of the present invention include a method of making a solar cell that contains stressed silicon near the p-n junctions or other active regions of the solar cell. One illustrative method involves etching a set of parallel trenches into a silicon wafer and inducing stress in the silicon between the trenches. The remaining silicon structures between the trenches in such a solar cell are referred to as "fins" and the fins include tensile stressed silicon. Junctions appropriate to a photovoltaic solar cell are formed in or near the fins.

The band gap of unstressed silicon is 1.12 eV at room temperature. Based on data in the literature, the present inventor calculates a uniaxial tensile strain of 1% in silicon reduces the band gap to 0.96 eV and a biaxial tensile strain of 1% reduces the band gap to approximately 0.88 eV. At a band gap of 1.12 eV, silicon does not capture photons with a wavelength longer than about 1.1 microns, so reducing the band gap will increase the energy capture by extending the wavelengths captured further into the infrared. At the same time, a reduction in band gap causes an increase in the absorption efficiency for longer wavelength (red) light which is desirable in image sensing devices such as charge coupled devices (CCD) and complimentary metal-oxide-semiconductor (CMOS) image sensors used in camera applications.

The starting point for preferred method implementations described here is to form a set of grooves or trenches on the surface of a silicon substrate or film. In the case of a solar cell these trenches preferably are between about 3 to 20 microns deep. The silicon fins between these grooves or trenches preferably have a height corresponding approximately to the depth of the etched trenches, a length of between 0.2 and 20 microns and a width of between about 0.2 to 2 microns. High aspect ratio fins (tall and thin) are desired to obtain a significant volume of silicon under tensile stress.

Figure 2A:
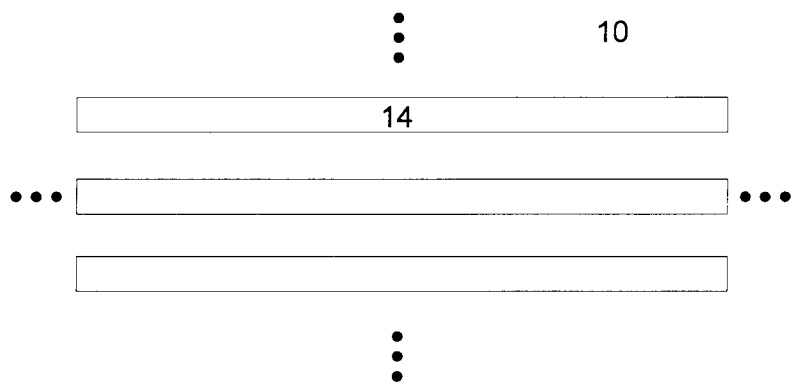
FIGS. 2a-2b plan view of array of fins on the surface of a solar cell, photodetector or imaging device.
Figure 2B:
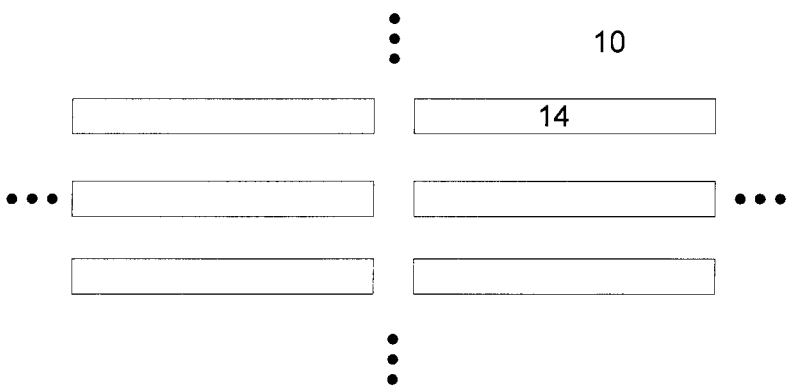

An example of a preferred process for forming high aspect ratio trenches and fins uses a low cost lithography technique to define a pattern of lines on a layer of masking material which may be organic photoresist on top of a silicon oxide or silicon nitride thin film. FIGS. 2a and 2b depict in plan view of an array of fins 14 formed on the surface of a silicon substrate 10. Low cost lithography techniques include nanoimprint pattern transfer, for example nanoindenting, in which the line pattern is impressed into an organic resist layer using a template on a roller. An alternative lithography process uses simple interference of two light beams to create a pattern of lines in the photoresist. The pattern is subsequently transferred into the oxide or nitride mask layer by dry or wet etching. Of course, more conventional (not necessarily low cost) photolithography can also be used.

After creating the desired pattern in a layer of a hard mask material such as a layer of silicon oxide or silicon nitride, the crystalline silicon fins may be formed by etching using a suitable dry or wet etch process. Appropriate dry etch processes include plasma or reactive ion etching processes as widely used in semiconductor and microelectromechanical (MEMS) device manufacturing. Appropriate wet etches for forming trenches in silicon include crystallographic etches based on a potassium hydroxide (KOH) solution or a tetramethylammonium hydroxide (TMAH) solution. These etch solutions selectively etch {100} and {110} crystal planes at a high rate relative to the etch rate for {111} planes, thus enabling high aspect ratio trenches to be etched in silicon wafers with {110} surface orientation, leaving fins with sidewalls defined by {111} surfaces, as described by Kendall "Vertical Etching of Silicon at very High Aspect Ratios" in Annual Review of Materials Science, Vol. 9, pp. 373 (1979).

Other wet etch processes include: electroless etching, including stain etching; chemical vapor etching, for example using mixtures of $HNO_3$ and HF; and metal-assisted etching.

After forming the trenches, several methods can be used to induce stress in the fins, and multiple methods can be used together. A first preferred method is to fill the trenches with tensile stressed silicon nitride or tensile stressed silicon oxide. Tensile stressed silicon nitride is well known in the semiconductor industry. When deposited in trenches as described here, a deposited layer of tensile stressed silicon nitride adheres to the walls of the trenches and generates uniaxial, tensile stress in the adjacent silicon fins in a direction normal to the face of the fin sidewalls. In addition to silicon nitride, other materials are known that exhibit tensile stress after deposition and also adhere to the walls of the trenches, inducing tensile stress in the adjacent silicon fins. An alternate insulating material with tensile stress is chemical vapor deposited (CVD) silicon oxide, for example deposited by sub-atmospheric CVD (SACVD) and subsequently annealed. The anneal step causes densification of the deposited silicon oxide and induces tensile stress in the material. This method is shown schematically in FIGS. 3b-3c.

Here, and throughout this document, this discussion relates to elastic stresses and deformation of materials. Generally this means that stress, a measure of applied or internal force, is directly related to strain, a measure of the change in size or deformation of a material in response to stress. For many aspects of the present discussion, the terms stress and strain can be used interchangeably to appropriately describe the phenomena of interest. For clarity, the terms tensile and compressive are used to refer to the different types of internal or external forces and to the different types of deformation, whether including expansion or compression. In most implementations of the present invention involving silicon or predominantly silicon materials, tensile strain is preferred in the materials used to form photosensitive regions because tensile strain is more effective and efficient in creating the increased sensitivity desired in many contemplated implementations.

Figure 3A:
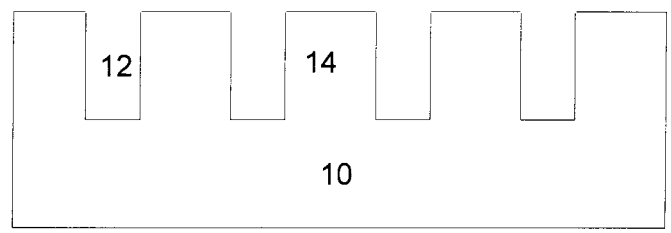
FIGS. 3b-3c schematically illustrate aspects of a preferred process for forming a silicon solar cell, photodetector or imaging device.
Figure 3B:
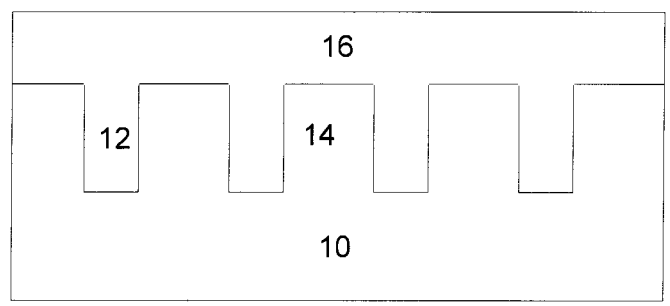
Figure 3C:
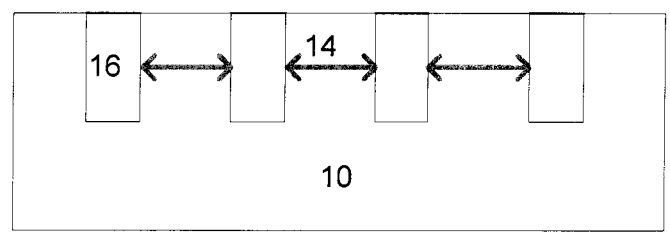

FIG. 3b depicts a single crystal silicon wafer 10 with grooves or trenches 12 created in it. As discussed above, a mask defining an array of trenches is formed on the silicon wafer or substrate 10, etching forms trenches 12 interspersed with silicon fins 14 and then the mask 15 is removed to provide the structure shown in FIG. 3b. The illustrated process proceeds to next deposit a layer 16 of silicon nitride or another tensile stressed material over the fins 14 and in the trenches 12 so that the trenches 12 are filled, as shown in FIG. 3b. After the blanket deposition of tensile stressed layer 16, the excess deposited material is removed using wet etching or other known technique such as chemical mechanical polishing. FIG. 3c shows the remaining silicon nitride or other layer 16 under tensile stress in the trenches, but removed from the wafer surface, and uniaxial tensile strain is induced in the width direction in the silicon fins 14 between the trenches. The tensile strain thus induced in the fins is sufficient to lower the bandgap at least of some of the silicon in the fins, and increase its efficiency in capturing the energy present in light, as already discussed. Preferred photovoltaic solar cell implementations form p-n junctions in or sufficiently near to the fins so that photo generated carriers are collected by the junction. Conventional doping strategies including diffusion and implantation can be performed either before or after forming trenches and fins.

In a solar cell or photodiode, silicon is typically doped to form a pn doping junction. Excess free carriers (electrons and holes) are produced when photons are absorbed and create electron-hole pairs. Electrons and holes generated inside the depletion region or within approximately a so-called diffusion length from the depletion region are captured by the depletion field. The depletion field transports electrons to the n-side of the junction and holes to the p-side of the junction. The fluxes of electron and holes provide an electrical current, i.e., the output of the solar cell or photodiode. In image sensors (charge coupled devices "CCD" or CMOS image sensors "CIS"), pn junctions are used to separate electrons and holes generated by photon absorption and to create a volume of stored charge for subsequent electronic read out.

Other junction types can be used as alternatives to doped pn junctions in photovoltaic solar cell, photodiode and image sensor device applications. Examples include Schottky barrier junctions formed at the interface between a metal and a semiconductor and metal-tunneling insulator-semiconductor (MIS) junctions.

After the steps shown in FIGS. 3b-3c and discussed above, conductors are attached to the top and bottom surfaces preferably according to conventional practice. Conductors on the surface containing the fins contact each of the silicon fins.

A thin film of silicon nitride may be deposited, for example by plasma enhanced chemical vapor deposition (PECVD), in a condition of either tensile or compressive stress as deposited. For example, Applied Materials reports that its Producer Celera system for plasma-enhanced CVD (PECVD) offers an integrated stress silicon nitride deposition and UV cure solution which delivers tensile stress of up to 1.7 GPa, with extendibility to 2.0 GPa, while meeting low thermal budget requirements. The same deposition chamber can deposit silicon nitride films with compressive stresses up to 3.5 GPa. By varying input factors in the PECVD process, predictable amounts of either tensile or compressive built-in stress in the range 1.7 GPa tensile to 3.0 GPa compressive can be selectively incorporated in a deposited silicon nitride thin film. Silicon nitride deposited in a state of either tensile or compressive stress allows a process to induce either compressive or tensile strain in the adjacent semiconductor, respectively.

Figure 4A:
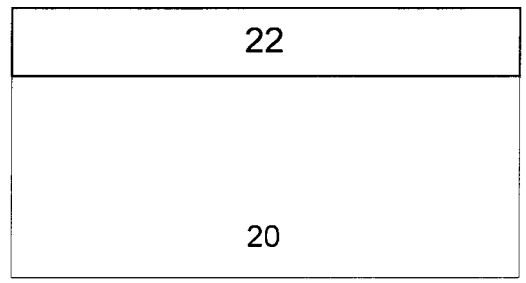
FIGS. 4a-4c schematically illustrate aspects of another preferred process for forming a silicon solar cell, detector or imaging device.
Figure 4B:
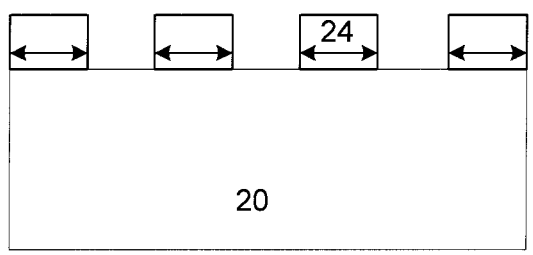
Figure 4C:
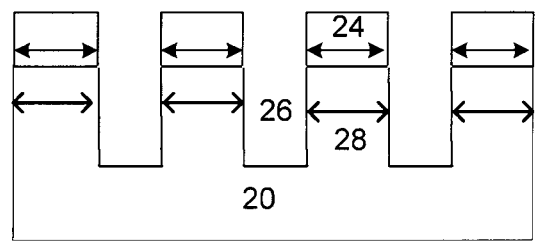

A second method implementation is shown schematically in FIGS. 4a-4c. The strategy of this illustrated method is to use compressively stressed material such as silicon nitride as a cap over a set of fins to induce tensile strain in the silicon fins. In this method, as shown in FIG. 4a, compressively stressed silicon nitride 22 is deposited on the surface of the silicon wafer 20 and used as a hard mask layer for etching. That is, compressive stressed silicon nitride layer 22 is patterned preferably using low cost photolithography to form a mask 24, as shown in FIG. 4b. Then trenches 26 are formed that define fins 28, using etching as was done in the method described above with the mask 24 defining the lateral extent of etching. When the trenches 26 are formed, a cap of compressively stressed silicon nitride 24 remains on the top of each fin 28 (FIG. 4c). This cap 24 expands laterally toward the trenches 26 to relieve some of the cap's compressive stress. Since the silicon nitride 24 adheres to the adjacent underlying silicon, the expansion of the cap 24 induces tensile strain in the silicon near the top of the fin 28.

Next, the trenches 26 are filled with a material that adheres to the trench walls. This material may also, advantageously, be under tensile stress and so may be silicon nitride or silicon oxide deposited to have tensile stress. After the trenches are filled, the caps 24 on the fins 28 preferably are removed. Much of the strain induced by the caps 24 will be retained in the fins 28 by the trench fill material. If the trench fill material is under tensile stress, the silicon in the fins 28 will be under tensile strain induced by both the caps and the trench fill material. Other cap materials that induce tensile strain in the silicon fins 28 may also be used.

Following the processes of forming fins 28 with lateral tensile strain, further processing is performed to complete the solar cell, detector or imaging device. If doping is not performed prior to depositing the compressive silicon nitride layer 22 (FIG. 4a), the process preferably dopes the tensile strained fins 28 to form junctions appropriate to a solar cell or imaging device. Following doping, conventional processing forms contacts on the substrate and fins to allow contact to the device.

Figure 5A:
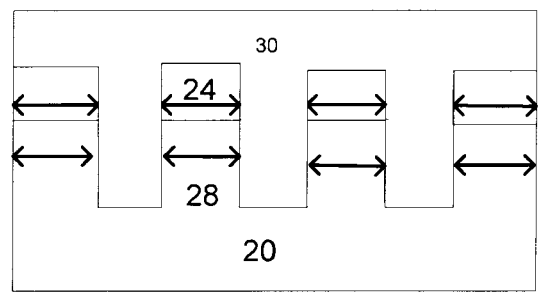
FIGS. 5a-5b schematically illustrate aspects of another preferred process in accordance with the present invention.
Figure 5B:
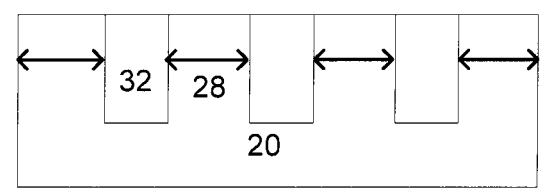

The process shown in FIGS. 4a-4c may or may not incorporate a tensile stressed trench fill material. That is, desirably strained fins are formed in the process illustrated in FIGS. 4a-4c. When a tensile strained trench fill material also is used, that is referred here as a combined process and is illustrated in FIGS. 5a and 5b. The illustration of FIGS. 5a and 5b use common numbering with FIGS. 4a-4c to identify like or similar structures and illustrate process steps following the process stage illustrated in FIG. 4c.

FIG. 5a shows the deposition of tensile stressed silicon nitride 30 after forming the compressively stressed silicon nitride caps 24 and etching the trenches between the fins 28. The tensile stressed silicon nitride 30 adheres to the walls of the trenches, inducing additional tensile strain in the fins 28 between the trenches. The strain from the tensile silicon nitride 30 in the trenches is additive to the strain induced by the relaxation or expansion of the compressive silicon nitride caps 24, resulting in more total strain in the fins 28 than would be present using either compressive stressed caps or tensile stressed silicon nitride trench fill material alone.

After the trenches have been filled, the silicon nitride (compressive caps and tensile stressed fill material) can then be removed to the level of the top of the fins, so as to expose the surfaces of the silicon fins (as shown in FIG. 5b). The silicon nitride or other excess stressor materials can be removed by wet etching or dry etching or other strategy such as chemical mechanical polishing. This leaves a silicon nitride or other plug 32 that contributes to the tensile strain in the fins 28. Doping is performed as described above with respect to FIG. 4c to form p-n junctions appropriate to the solar cell, photodiode or imaging device. Electrodes are then connected to the surfaces of the fins and to the opposite surface of the solar cell or other device in the conventional manner.

Figure 6A:
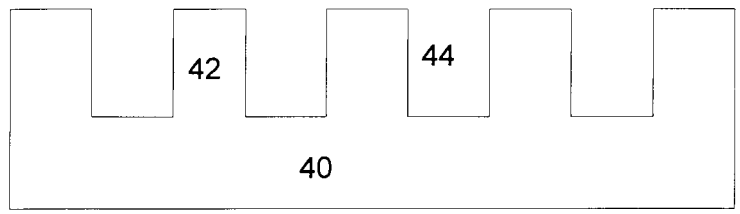
FIGS. 6a-6d schematically illustrate aspects of another preferred process for forming a silicon solar cell, photodetector or imaging device.
Figure 6B:
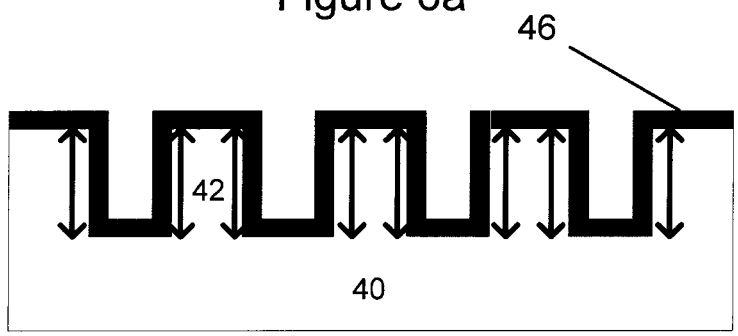
Figure 6C:
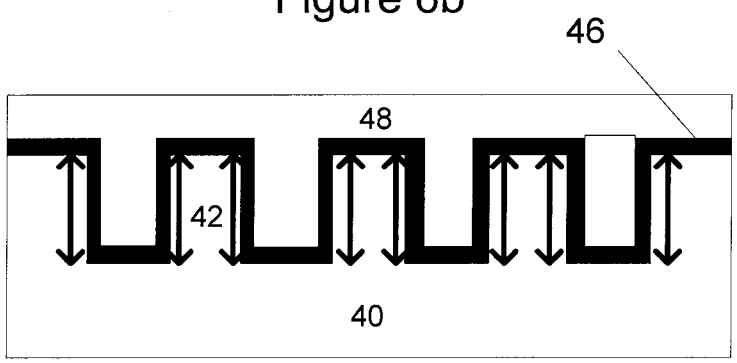

Another preferred process according to the present invention is shown schematically in FIGS. 6a-6d. In this method, trenches are etched in each fin, as shown in FIG. 2b, in addition to the trenches between fins. The length of each section of fin is preferably between 1 and 10 microns. A preferred aspect of this method uses a compressively stressed material such as silicon nitride as a trench liner deposited over a set of fins to induce tensile strain in the silicon fins. FIG. 6a shows a silicon substrate 40 with fins 42 and trenches 44 formed in any of the ways described above. As shown in FIG. 6b, a compressively stressed silicon nitride liner 46 is deposited on the surface of the fins 42. The silicon nitride liner 46 preferably does not completely fill the trenches and layers deposited on opposing trench sidewalls do not meet except at the bottom of the trenches 44. Since the silicon nitride liner layer 46 adheres to the adjacent silicon of the fins 42, the expansion of the silicon nitride liner layer 46 induces biaxial tensile strain in the silicon in the fin 42 parallel to the sidewall of the fin.

Figure 6D:
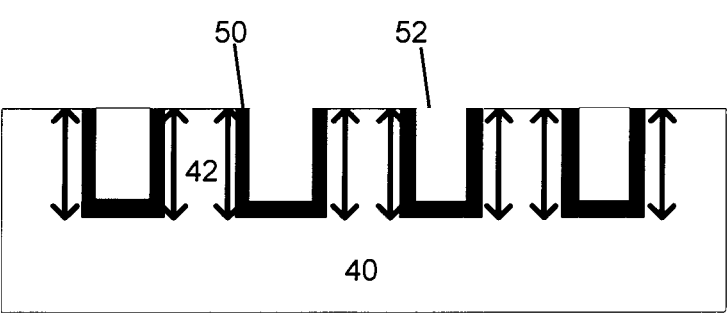

Next, the trenches are filled with a second deposited material 48 that preferably adheres well to the silicon nitride liner 46 material. This second material 48 should be unstressed and serves to provide complete filling of the trenches which will benefit the subsequent etch-back process of the silicon nitride from the top of the silicon fins with minimal loss of nitride from within the trenches. After the trenches are filled with the unstressed trench fill material 48, the first compressively stressed material and the second deposited layers are removed from the tops of the fins as indicated in FIG. 6d. Both materials remain substantially in the trenches. If the trench fill material 48 is unstressed, the silicon in the fins 42 will be under biaxial tensile strain parallel to the trench walls induced by the compressive liner material. Further processing, including doping as necessary to form p-n junctions appropriate to the desired solar cell or other device, is performed as discussed above to complete the solar cell or other desired device.

Alternatively the trenches are completely filled with compressively stressed material such as compressively stressed PECVD silicon nitride, in which case the compressive silicon nitride induces a biaxial strain in the silicon fins in the plane parallel to the fin sidewall faces and additionally a uniaxial compressive strain directed normal to the fin sidewall faces.

Another preferred process according to the present invention grows silicon oxide in the trenches by reaction of the surface of the silicon fin material with an oxidizing agent at elevated temperature. Volume expansion of the oxide formed by the thermal oxidation reaction causes the oxide to be under a compressive stress and the magnitude of the compressive stress will tend to be greater as the trench is completely filled with grown oxide. As a result of the compressive silicon oxide filling the trenches, a biaxial tensile strain is induced in the silicon fins primarily parallel to the faces of the fin sidewalls and a uniaxial compressive strain is induced in the silicon fins primarily normal to the fin sidewall faces.

In operation, light enters the solar cell. In some designs, the fins in which tensile strained silicon appears will be on the same side of the cell on which light is received, and in other applications the fins, and consequently the strained silicon, will be on the opposite side from which light enters the cell.

Because the fins are strained, the band gap of at least part of the silicon in the fins is less than the strain-free or equilibrium band gap of bulk silicon. As a result, photons with longer wavelengths will generate electron-hole pairs, increasing the efficiency of the solar cell. These electron-hole pairs represent additional current beyond that which would have been generated in a cell without any strained material. The additional light energy thus captured will contribute to an improved overall efficiency of the cell.

Fundamental to the operation of a solar cell or an image capture device is the use of a p-n junction to cause a charge separation and enabling a current to appear. In silicon and other semiconductor materials, appropriate doping of p type and n type materials creates a junction containing a "depletion region" that causes the flux of electron-hole pairs to appear.

The position of the p-n junctions and the associated depletion regions vary depending on the design of the solar cell or sensor. Independent of the position of the depletion region, electron-hole pairs may be created anywhere within the silicon of the cell or sensor. If the distance of the depletion region from the electron-hole pair creation site is sufficiently small (a design objective for cells or sensors), then generated electron-hole pairs are likely to contribute to the current generated (in the case of a solar cell or photodiode) or to the charge captured (in the case of a CCD or CMOS image sensor cell).

Generating strain in some of the silicon or other material from which solar cells or light sensors is constructed, therefore, applies to the full range of such devices.

The methods presented here may apply to CMOS image sensors, in which the silicon or other material used to capture each pixel may consist of a single fin, or a set of fins. If the fins are wide, more strain may appear in the silicon near the trenches than is present in the center of each fin. Uniform strain is not necessary to derive the benefits of the described structure. It is sufficient that a volume of silicon be strained. This volume will have a lower bandgap than unstrained silicon, with a corresponding improvement in the efficiency with which it responds to longer wavelengths of light compared with unstrained silicon.

Other semiconductor materials, including elements such as germanium and compounds such as gallium arsenide, can also be used to convert light to electric current. Aspects of the invention described here are applicable to solar cells, photodiodes, avalanche photodiodes, image sensors, and other applications whose performance would be improved by increasing the rate of absorption of photons and generation of electron-hole pairs for longer wavelengths of light. Though the description here is in terms of silicon, it is to be understood that the concepts, devices and methods described here apply equally to all materials and compounds for which the response to long wavelengths of light can be improved by the use of strain in these materials or compounds.

The present invention has been described in terms of certain preferred embodiments. Those of ordinary skill in the art will appreciate that various modifications and alterations could be made to the specific preferred embodiments described here without varying from the teachings of the present invention. Consequently, the present invention is not intended to be limited to the specific preferred embodiments described here but instead the present invention is to be defined by the appended claims.

I claim:

1. A photosensitive device, comprising:
a silicon substrate having a plurality of trenches on a surface, the trenches positioned to define at least one silicon fin; and
stressed material within at least two of the trenches, the stressed material inducing tensile strain within the at least one silicon fin to reduce the band gap of at least a portion of the silicon within the at least one silicon fin and to provide increased sensitivity of the tensile strained portion of the fin to longer wavelength light.

2. The device of claim 1, wherein the photosensitive device is a silicon solar cell and wherein a p-n junction is formed in the at least one silicon fin.

3. The device of claim 1, wherein the stressed material is compressively stressed silicon nitride adhered to at least one side surface of the at least one silicon fin.

4. The device of claim 1, wherein the stressed material is tensile strained silicon oxide or silicon nitride adhered to walls of adjacent fins.

5. The device of claim 1, wherein the at least one silicon fin is crystalline silicon and the trenches have a depth of between about 0.3 microns and twenty microns and the fins have a width of between about 0.2 microns and one micron and a length of between 0.3 microns and twenty microns.

6. The device of claim 1, wherein the photosensitive device is a silicon solar cell and wherein a p-n junction is formed within a diffusion length of a reduced band gap and strained portion of the at least one silicon fin.

7. The device of claim 1, wherein the photosensitive device is an image sensor cell and wherein a p-n junction is formed within a diffusion length of a reduced band gap and strained portion of the at least one silicon fin.

8. The device of claim 1, wherein the photosensitive device is an infrared photodetector capable of detecting photons in a wavelength range between 800 nanometers and 1400 nanometers and wherein a p-n junction is formed within a diffusion length of a reduced band gap and strained portion of the at least one silicon fin.

9. The device of claim 1, wherein the stressed material fills each of the two trenches.

10. The device of claim 1, wherein the stressed material fills each of the two trenches and induces tensile strain in the one silicon fin.

11. The device of claim 10, wherein the tensile strain is uniaxial in a direction normal to sidewalls of the one silicon fin.

12. The device of claim 10, wherein the tensile strain in the one silicon fin is sufficient to reduce the bandgap of the silicon within the one silicon fin by an observable amount.

* * * * *